United States Patent
Grumbine

(10) Patent No.: US 7,501,346 B2
(45) Date of Patent: Mar. 10, 2009

(54) GALLIUM AND CHROMIUM IONS FOR OXIDE RATE ENHANCEMENT

(75) Inventor: Steven K. Grumbine, Aurora, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

(21) Appl. No.: 11/491,055

(22) Filed: Jul. 21, 2006

(65) Prior Publication Data

US 2008/0020577 A1     Jan. 24, 2008

(51) Int. Cl.
*H01L 21/461* (2006.01)
(52) U.S. Cl. .................. 438/689; 252/79; 438/693; 438/709; 451/28; 451/36; 451/41
(58) Field of Classification Search ............... 252/79; 438/709; 451/36
See application file for complete search history.

(56) References Cited

U.S. PATENT DOCUMENTS

| | | | |
|---|---|---|---|
| 4,959,113 A * | 9/1990 | Roberts .................. 216/89 |
| 5,196,353 A | 3/1993 | Sandhu et al. |
| 5,230,833 A | 7/1993 | Romberger et al. |
| 5,366,542 A * | 11/1994 | Yamada et al. ............. 106/3 |
| 5,433,651 A | 7/1995 | Lustig et al. |
| 5,609,511 A | 3/1997 | Moriyama et al. |
| 5,643,046 A | 7/1997 | Katakabe et al. |
| 5,658,183 A | 8/1997 | Sandhu et al. |
| 5,730,642 A | 3/1998 | Sandhu et al. |
| 5,838,447 A | 11/1998 | Hiyama et al. |
| 5,872,633 A | 2/1999 | Holzapfel et al. |
| 5,893,796 A | 4/1999 | Birang et al. |
| 5,949,927 A | 9/1999 | Tang |
| 5,964,643 A | 10/1999 | Birang et al. |
| 6,171,352 B1 * | 1/2001 | Lee et al. ................. 51/307 |
| 6,293,848 B1 * | 9/2001 | Fang et al. ................ 451/36 |
| 6,626,967 B2 | 9/2003 | Takami et al. |
| 6,849,099 B2 | 2/2005 | Ohno et al. |
| 6,936,541 B2 * | 8/2005 | Bian et al. .............. 438/691 |
| 2001/0006224 A1 | 7/2001 | Tsuchiya et al. |
| 2002/0025762 A1 * | 2/2002 | Luo et al. ................. 451/41 |
| 2002/0039839 A1 | 4/2002 | Thomas et al. |
| 2003/0176072 A1 * | 9/2003 | Wang et al. .............. 438/709 |

* cited by examiner

*Primary Examiner*—Duy-Vu Deo
*Assistant Examiner*—Maki Angadi
(74) *Attorney, Agent, or Firm*—Thomas E. Omholt; Francis J. Koszyk; Steven D. Weseman

(57) ABSTRACT

The invention provides a chemical-mechanical polishing composition comprising silica, a compound in an amount sufficient to provide about 0.2 mM to about 10 mM of a metal cation selected from the group consisting of gallium (III), chromium (II), and chromium (III), and water, wherein the polishing composition has a pH of about 1 to about 6. The invention further provides a method of chemically-mechanically polishing a substrate with the aforementioned polishing composition.

22 Claims, No Drawings

GALLIUM AND CHROMIUM IONS FOR OXIDE RATE ENHANCEMENT

FIELD OF THE INVENTION

The invention pertains to chemical-mechanical polishing compositions and methods.

BACKGROUND OF THE INVENTION

Integrated circuits are made up of millions of active devices formed in or on a substrate, such as a silicon wafer. The active devices are chemically and physically connected into a substrate and are interconnected through the use of multilevel interconnects to form functional circuits. Typical multilevel interconnects comprise a first metal layer, an interlevel dielectric layer, and sometimes a third and subsequent metal layers. Interlevel dielectrics, such as doped and undoped silicon dioxide ($SiO_2$) and/or low-κ dielectrics, are used to electrically isolate the different metal layers. As each layer is formed, typically the layer is planarized to enable subsequent layers to be formed on top of the newly formed layer.

One way to fabricate planar metal circuit traces on a dielectric substrate is referred to as the damascene process. In accordance with this process, the dielectric surface is patterned by a conventional dry etch process to form holes and trenches for vertical and horizontal interconnects. The patterned surface is coated with an adhesion-promoting layer such as titanium or tantalum and/or a diffusion barrier layer such as titanium nitride or tantalum nitride. The adhesion-promoting layer and/or the diffusion barrier layer are then over-coated with a copper layer or a tungsten layer. Chemical-mechanical polishing is employed to reduce the thickness of the copper layer or tungsten over-layer, as well as the thickness of any adhesion-promoting layer and/or diffusion barrier layer, until a planar surface that exposes elevated portions of the silicon dioxide surface is obtained. The vias and trenches remain filled with electrically conductive copper or tungsten forming the circuit interconnects.

In some applications, it is desirable to employ an additional polishing step after polishing of a metal layer and/or a barrier layer in order to adequately planarize the dielectric surface. Typically, polishing compositions and methods suitable for the chemical-mechanical polishing of metal and/or barrier layers are not suitable for the polishing of dielectric layers comprising silicon dioxide.

Another semiconductor fabrication method requiring the polishing of silicon dioxide layers is the shallow trench isolation (STI) process. In accordance with the STI process, a silicon nitride layer is formed on a silicon substrate, shallow trenches are formed via etching or photolithography, and a dielectric layer, typically silicon dioxide, is deposited to fill the trenches. Due to variation in the depth of trenches formed in this manner, it is typically necessary to deposit an excess of dielectric material on top of the substrate to ensure complete filling of all trenches.

The dielectric material conforms to the underlying topography of the substrate. Thus, the surface of the substrate is characterized by raised areas of the overlying oxide between trenches. The excess dielectric lying outside of the trenches is then typically removed by a chemical-mechanical planarization process, which additionally provides a planar surface for further processing.

Currently, there are two primary methods used in the chemical-mechanical planarization of silicon dioxide. A first method comprises use of high solids content (10-20 wt. %) silica-based polishing compositions having a pH of greater than 10. The high solids content results in a high cost for such polishing compositions. A second method comprises use of cerium oxide abrasives in polishing compositions. Although cerium oxide-based polishing compositions exhibit high removal rates when used to polish silicon dioxide layers, cerium ions derived from the cerium oxide abrasive can contaminate substrate structures, necessitating aggressive post-CMP cleaning processes. Disadvantages of these polishing compositions include low polishing rates when the silica content is reduced, higher costs when the silica content is increased to raise the polishing rates, and low polishing rates typically exhibited with respect to other components of the substrate surface, such as tantalum.

Thus, there remains a need in the art for compositions and methods for chemical-mechanical planarization of silicon dioxide-containing substrates that will provide useful removal rates for silicon dioxide.

BRIEF SUMMARY OF THE INVENTION

The invention provides a chemical-mechanical polishing composition comprising, consisting essentially of, or consisting of (a) silica, (b) a compound in an amount sufficient to provide about 0.2 mM to about 10 mM of a metal cation selected from the group consisting of gallium (III), chromium (II), and chromium (III), and (c) water, wherein the polishing composition has a pH of about 1 to about 6. The invention also provides a method of chemically-mechanically polishing a substrate, which method comprises (i) providing a substrate, (ii) contacting the substrate with a polishing pad and a chemical-mechanical polishing composition comprising, consisting essentially of, or consisting of (a) silica, (b) a compound in an amount sufficient to provide about 0.2 mM to about 10 mM of a metal cation selected from the group consisting of gallium (III), chromium (II), and chromium (III), and (c) water, wherein the polishing composition has a pH of about 1 to about 6, (iii) moving the polishing pad relative to the substrate with the chemical-mechanical polishing composition therebetween, and (iv) abrading at least a portion of the substrate to polish the substrate.

DETAILED DESCRIPTION OF THE INVENTION

The invention provides a chemical-mechanical polishing composition comprising, consisting essentially of, or consisting of (a) silica, (b) a compound in an amount sufficient to provide about 0.2 mM to about 10 mM of a metal cation selected from the group consisting of gallium (III), chromium (II), and chromium (III), and (c) water, wherein the polishing composition has a pH of about 1 to about 6. The polishing composition desirably provides for enhanced removal rates when used to polish substrates comprising dielectric materials, particularly silicon dioxide-based dielectric materials.

The polishing composition comprises silica. The silica can be any suitable form of silica. Useful forms of silica include but are not limited to fumed silica, precipitated silica, and condensation-polymerized silica. Most preferably, the silica is a condensation-polymerized silica. Condensation-polymerized silica particles typically are prepared by condensing $Si(OH)_4$ to form colloidal particles. The precursor $Si(OH)_4$ can be obtained, for example, by hydrolysis of high purity alkoxysilanes, or by acidification of aqueous silicate solutions. Condensation-polymerized silica is also referred to as sol-gel silica. Such abrasive particles can be prepared in accordance with U.S. Pat. No. 5,230,833 or can be obtained as any of various commercially available products, such as the Fuso PL-1, PL-2, and PL-3 products, and the Nalco 1034 A, 1050, 2327, and 2329 products, as well as other similar products available from DuPont, Bayer, Applied Research, Nissan Chemical, and Clariant.

The silica can be in the form of primary particles and/or aggregates of primary particles. As is well known in the art, abrasive particles comprise, at the lowest level of structure, primary particles. Primary particles are formed by covalent bonds between atoms comprising the particles and are stable to all but the harshest conditions. At the next level of structure, primary particles are associated into secondary particles, generally referred to as aggregates. Aggregate particles comprise primary particles and are bonded together by covalent bonds and electrostatic interactions, and typically are resistant to degradation by, e.g., mechanical energy inputs such as high-shear mixing. At the next level of structure, aggregates are more loosely associated into agglomerates. Typically, agglomerates can be disassociated into the constituent aggregates via mechanical energy inputs. Depending on the particular composition and method of preparation, primary particles and secondary particles (e.g., aggregates) can have shapes ranging from spherical to elliptical, and some aggregates can have extended, chain-like structures. For example, pyrogenic, or fumed, silica typically exists in the form of aggregates having a chain-like structure. Precipitated silicas, for example, silicas prepared by neutralization of sodium silicate, have an aggregate structure in which approximately spherical primary particles are associated into aggregates that resemble a "bunch of grapes." Both primary abrasive particles and aggregated primary particles (e.g., secondary particles) can be characterized as having an average particle size. In this regard, particle size refers to the diameter of the smallest sphere that encloses the particle.

Desirably, the silica is substantially nonagglomerated. The silica typically has a mean particle size of about 5 nm or more (e.g., about 10 nm or more, or about 15 nm or more, or about 20 nm or more). Preferably, the silica has a mean particle size of about 150 nm or less (e.g., about 100 nm or less, or about 80 nm or less, or about 50 nm or less). More preferably, the silica has a mean particle size of about 5 nm to about 150 nm, or about 10 nm to about 1000 nm, or about 20 nm to about 80 nm. In this regard, mean particle size refers to the average size of the silica particles present in the polishing composition without limitation of the particles as to having any particular structure (e.g., as being primary particles or aggregates of primary particles).

The silica desirably is suspended in the polishing composition, more specifically in the water of the polishing composition. When the silica is suspended in the polishing composition, the silica preferably is colloidally stable. The term colloid refers to the suspension of silica particles in the water. Colloidal stability refers to the maintenance of that suspension over time. In the context of this invention, a silica is considered colloidally stable if, when a suspension of the silica in water is placed into a 100 ml graduated cylinder and allowed to stand unagitated for a time of 2 hours, the difference between the concentration of particles in the bottom 50 ml of the graduated cylinder ([B] in terms of g/ml) and the concentration of particles in the top 50 ml of the graduated cylinder ([T] in terms of g/ml) divided by the initial concentration of particles in the silica composition ([C] in terms of g/ml) is less than or equal to 0.5 (i.e., $\{[B]-[T]\}/[C] \leq 0.5$). The value of $[B]-[T]/[C]$ desirably is less than or equal to 0.3, and preferably is less than or equal to 0.1.

Any suitable amount of silica can be present in the polishing composition. Typically, about 0.01 wt. % or more silica can be present in the polishing composition (e.g., about 0.05 wt. % or more, or about 0.1 wt. % or more, or about 1 wt. % or more). The amount of silica in the polishing composition preferably will not exceed about 10 wt. %, and more preferably will not exceed about 8 wt. % (e.g., will not exceed about 6 wt. %). Even more preferably the silica will comprise about 0.5 wt. % to about 10 wt. % (e.g., about 1 wt. % to about 6 wt. %) of the polishing composition.

The polishing composition comprises a compound comprising a metal cation selected from the group consisting of gallium (III), chromium (II), and chromium (III). The compound can be any suitable compound comprising gallium (III), chromium (II), or chromium (III). Preferably, the compound is a salt comprising gallium (III), chromium (II), or chromium (III), in combination with any suitable anion. The anion desirably is selected from the group consisting of organic carboxylates, chloride, nitrate, and sulfate. Examples of suitable salts include but are not limited to gallium acetate, gallium chloride, gallium nitrate, gallium sulfate, chromium (II) acetate, chromium (II) chloride, chromium (II) nitrate, chromium (II) sulfate, chromium (III) acetate, chromium (III) chloride, chromium (III) nitrate, and chromium (III) sulfate. Most preferably, the salt is gallium nitrate. The gallium (III), chromium (II), or chromium (III) salt can be anhydrous or can be any hydrate thereof. Further, the gallium (III), chromium (II), or chromium (III) salt can also be a cationic complex of gallium (III), chromium (II), or chromium (III). For example, suitable gallium (III) compounds include aqua, pyridine, bipyridine, and phenthroline complexes of gallium (III). Suitable complexes of chromium (II) and chromium (III) include but are not limited to aqua and hexaammonio complexes thereof. The cationic complex can have any suitable counteranion as described herein.

The concentration of gallium (III), chromium (II), or chromium (III) in the polishing composition desirably is about 0.2 mM or more (e.g., about 1 mM or more, or about 2 mM or more). The concentration of gallium (III), chromium (II), or chromium (III) in the polishing composition preferably is about 10 mM or less (e.g., about 9 mM or less, or about 8 mM or less, or even about 7 mM or less). In this regard, the concentration of gallium (III), chromium (II), or chromium (III) refers to the formal concentration of gallium (III), chromium (II), or chromium (III) that is dissolved and present in solution as a dissociated ionic species in the polishing composition, whether the gallium (III), chromium (II), or chromium (III) is present as a simple solvated cation, as a complex thereof, or as a chelate thereof. If the concentration of gallium (III), chromium (II), or chromium (III) in the polishing composition is too low, no enhancement of the dielectric polishing rate will be observed. If the concentration of gallium (III), chromium (II), or chromium (III) in the polishing composition is too high, the silica particles may exhibit a tendency to form large agglomerates. Formation of large agglomerates of silica particles tends to produce scratches on the surface of a substrate being polished by the large agglomerates, as well as contributes to colloidal instability of the polishing composition.

The polishing composition can comprise two or more compounds that provide two or more different metal cations selected from the group consisting of gallium (III), chromium (II), and chromium (III). When the polishing composition comprises two or more such compounds, each compound can be present in an amount sufficient to provide about 0.2 mM to about 10 mM of each of the metal cations. Preferably, when the polishing composition comprises two or more such compounds, the compounds are present in an amount sufficient to provide a total combined concentration of about 0.2 mM to about 10 mM of the metal cations.

The polishing composition optionally comprises a chelating agent (e.g., a complexing agent). In the context of the invention, a chelating agent is a molecule that chelates with the metal cation (i.e., complexes with gallium (III), chromium (II), or chromium (III)). A chelating agent is defined in the McGraw-Hill Dictionary of Scientific and Technical Terms (3rd ed., 1984) as an organic compound in which atoms form more than one coordinate bond with metals in solution. The chelating agent can be added to the polishing composition as a separate component, or the compound can comprise a chelating agent as part of the compound itself. The chelating agent can be any molecule that forms a chelate with gallium (III), chromium (II), or chromium (III). Alternatively, the compound can be any suitable chelate compound comprising gallium (III), chromium (II), or chromium (III).

The chelating agent typically comprises one or more functional groups selected from the group consisting of amino groups, amide groups, carboxylic acid groups, hydroxy groups, phenol groups, and salts thereof. Non-limiting examples of suitable chelating agents include ethylenediamine, ethylenediaminetetraacetic acid (i.e., EDTA), iminodiacetic acid, propylenediaminetetraacetic acid, carboxylic acids (e.g., oxalates, phthalates, citrates, succinates, tartrates, malates, $\beta$-ketocarboxylic acids), $\beta$-diketones, pyrocatechol, salts thereof, and combinations thereof. Non-limiting examples of suitable chelate compounds of gallium (III), chromium (II), and chromium (III) include those described in Advanced Inorganic Chemistry, F. A. Cotton and G. Wilkinson, eds., $4^{th}$ ed., John Wiley and Sons, New York (1980), and references cited therein.

The polishing composition comprises water. The water is used to facilitate the application of the abrasive particles, the salt, and any other additives to the surface of a suitable substrate to be polished or planarized. Preferably, the water is deionized water.

The polishing composition has a pH that is about 6 or less (e.g., about 5 or less, or about 4 or less). Preferably, the polishing composition has a pH that is about 1 or more (e.g., about 2 or more). More preferably, the polishing composition has a pH of about 1 to about 6 (e.g., about 2 to about 5, or about 2 to about 4). If the pH is too high, gallium, chromium (II), and chromium (III) cations tend to form the corresponding metal hydroxides, which can reduce polishing efficiency, possibly due to interaction between the metal hydroxides and the surface of a substrate being polished. The polishing composition optionally comprises pH adjusting agents, for example nitric acid, sulfuric acid, phosphoric acid, ammonium hydroxide, or potassium hydroxide. The polishing composition optionally comprises pH buffering systems, for example potassium dihydrogen phosphate or potassium hydrogen sulfate. Many such pH buffering systems are well known in the art. If the polishing composition comprises pH adjusting agents and/or buffering systems, the polishing composition will contain a sufficient amount of pH adjusting agents and/or buffering systems to maintain the pH in the ranges set forth herein.

The polishing composition optionally further comprises one or more other additives. Such additives include any suitable surfactant and/or rheological control agent, including viscosity enhancing agents and coagulants (e.g., polymeric rheological control agents, such as, for example, urethane polymers), acrylates comprising one or more acrylic subunits (e.g., vinyl acrylates and styrene acrylates), and polymers, copolymers, and oligomers thereof, and salts thereof. Suitable surfactants include, for example, cationic surfactants, anionic surfactants, anionic polyelectrolytes, nonionic surfactants, amphoteric surfactants, fluorinated surfactants, mixtures thereof, and the like.

The polishing composition optionally further comprises a biocide. The biocide can be any suitable biocide, for example an isothiazolinone biocide. The amount of biocide used in the polishing composition typically is about 1 ppm to about 500 ppm, and preferably is about 10 ppm to about 200 ppm.

The polishing composition desirably contains substantially no component(s) having a standard reduction potential greater than (i.e., more positive than) the gallium (III) compound, the chromium (II) compound, or the chromium (III) compound. In particular, the polishing composition desirably contains substantially no, or contains no, component having a standard reduction potential greater than (i.e., more positive than) about −0.3 V versus a standard hydrogen electrode.

The polishing composition of the invention can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., silica, compound, etc.) as well as any combination of ingredients (e.g., silica, compound, optional chelating agent, etc.).

For example, the silica can be dispersed in water. The compound can then be added, and the polishing composition can be mixed by any method that is capable of incorporating the components into the polishing composition. The polishing composition can be prepared prior to use, with one or more components, such as the compound, added to the polishing composition just before use (e.g., within about 1 minute before use, or within about 1 hour before use, or within about 7 days before use). The pH can be adjusted at any suitable time. The polishing composition also can be prepared by mixing the components at the surface of the substrate during the polishing operation.

The polishing composition also can be provided as a concentrate which is intended to be diluted with an appropriate amount of water prior to use. In such an embodiment, the polishing composition concentrate can comprise silica, a compound, and water in amounts such that, upon dilution of the concentrate with an appropriate amount of water, each component of the polishing composition will be present in the polishing composition in an amount within the appropriate range recited above for each component.

For example, the silica and compound can each be present in the concentrate in an amount that is about 2 times (e.g., about 3 times, about 4 times, or about 5 times) greater than the concentration recited above for each component so that, when the concentrate is diluted with an equal volume of water (e.g., 2 equal volumes water, 3 equal volumes of water, or 4 equal volumes of water, respectively), each component will be present in the polishing composition in an amount within the ranges set forth above for each component. Furthermore, as will be understood by those of ordinary skill in the art, the concentrate can contain an appropriate fraction of the water present in the final polishing composition in order to ensure that the compound and other suitable additives are at least partially or fully dissolved in the concentrate.

The invention further provides a method of polishing a substrate comprising (i) providing a substrate, (ii) contacting the substrate with a polishing pad and the polishing composition described herein, (iii) moving the polishing pad relative to the substrate with the polishing composition therebetween, and (iv) abrading at least a portion of the substrate to polish the substrate.

The method of the invention can be used to polish any suitable substrate, and is especially useful for polishing substrates comprising at least one dielectric layer. Suitable substrates include wafers used in the semiconductor industry. The method of the invention is well-suited for planarizing or polishing a substrate further comprising at least one metal layer in addition to at least one dielectric layer. The substrate can be any suitable metal-containing substrate (e.g., an integrated circuit), and can further comprise any suitable barrier layer.

The at least one dielectric layer can comprise any suitable dielectric material. Preferably, the at least one dielectric layer comprises a material selected from the group consisting of silicon dioxide, carbon-doped silicon dioxide, and organically-modified silicon glass. A non-limiting example of a suitable silicon dioxide material is silicon dioxide generated via chemical vapor deposition (CVD) using tetraorthosilicate (TEOS) as a feedstock.

The at least one metal layer can be any suitable metal layer. Preferably, the at least one metal layer is selected from the group consisting of aluminum, copper, tungsten, and combinations thereof. The at least one barrier layer can comprise any suitable barrier material. Preferably, the at least one barrier layer comprises a barrier material selected from the group consisting of tantalum, titanium, nitrides thereof, and combinations thereof.

In an embodiment, the substrate comprises at least one metal layer, at least one barrier layer, and at least one dielectric layer, wherein the substrate has been subjected to a damascene process or a dual damascene process. In a damascene process or a dual damascene process, after at least one metal layer and/or at least one barrier layer of a substrate has been removed by chemical-mechanical planarization to expose at least one underlying dielectric layer, the at least one dielectric layer may require chemical-mechanical planarization using a polishing composition that is suitable for the polishing of the at least one dielectric layer, in order to provide a substrate surface sufficiently planar for subsequent device fabrication steps. The inventive method is well suited for the planarization of the at least one dielectric layer.

The polishing composition also can be utilized for planarizing or polishing a substrate that has undergone shallow trench isolation (STI) processing. STI processing typically involves providing a silicon substrate on which is deposited a layer of silicon nitride. Trenches are etched onto a substrate comprising an overlying layer of silicon nitride following photolithography, and an excess of silicon dioxide is deposited thereon. The substrate is then subjected to planarization until the excess surface layer of silicon oxide is substantially removed, such that the silicon oxide remaining in the trenches is approximately level with the edges of the trenches.

The polishing method of the invention is particularly suited for use in conjunction with a chemical-mechanical polishing (CMP) apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with the polishing pad and the polishing composition of the invention and then the polishing pad moving relative to the substrate, so as to abrade at least a portion of the substrate to polish the substrate.

A substrate can be planarized or polished with the chemical-mechanical polishing composition with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

Desirably, the CMP apparatus further comprises an in situ polishing endpoint detection system, many of which are known in the art. Techniques for inspecting and monitoring the polishing process by analyzing light or other radiation reflected from a surface of the workpiece are known in the art. Such methods are described, for example, in U.S. Pat. Nos. 5,196,353, 5,433,651, 5,609,511, 5,643,046, 5,658,183, 5,730,642, 5,838,447, 5,872,633, 5,893,796, 5,949,927, and 5,964,643. Desirably, the inspection or monitoring of the progress of the polishing process with respect to a workpiece being polished enables the determination of the polishing end-point, i.e., the determination of when to terminate the polishing process with respect to a particular workpiece.

The following example further illustrates the invention but, of course, should not be construed as in any way limiting its scope.

EXAMPLE

This example illustrates the significance of the introduction of a gallium salt on the removal rate of a silicon dioxide substrate at various pH values.

Similar substrates comprising silicon dioxide were polished with eight different polishing compositions (Compositions A-H). Compositions A-D comprised 2 wt. % of a condensation-polymerized silica with each of Compositions A-D having a different pH. Compositions E-H corresponded to Compositions A-D with the further additions of 5 mM of gallium nitrate. The pH of each of the polishing compositions is set forth in the Table.

The substrates were polished with a IC1000 polishing pad (Rohm and Haas Electronic Materials, Newark, Del.) at a downforce of 13.8 kPa (2.0 psi) and a polishing composition flow rate of 100 mL/min. Following use of the polishing compositions, the silicon dioxide removal rates ($SiO_2$ RR) were determined, with the resulting data set forth in the Table.

TABLE

| pH | Composition | $SiO_2$ RR (Å/min) | Composition | $SiO_2$ RR (Å/min) |
|---|---|---|---|---|
| 2.1 | A (comparative) | 240 | E (invention) | 195 |
| 2.6 | B (comparative) | 138 | F (invention) | 310 |
| 3.1 | C (comparative) | 50 | G (invention) | 255 |
| 3.6 | D (comparative) | 45 | H (invention) | 195 |

As is apparent from the results set forth in the Table, Compositions F, G, and H, containing 5 mM of gallium nitrate and having a pH of 2.6, 3.1, and 3.6, respectively, exhibited removal rates for silicon dioxide that were 2.2, 5.1, and 4.3 times greater than observed for the comparative Compositions B, C, and D at the same pH values that did not contain gallium nitrate.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical-mechanical polishing composition consisting of:
   (a) condensation-polymerized silica,
   (b) a compound in an amount sufficient to provide about 0.2 mM to about 10 mM of a metal cation selected from the group consisting of gallium (III), chromium (II), and chromium (III),
   (c) a pH adjusting agent selected from the group consisting of nitric acid, sulfuric acid, phosphoric acid, ammonium hydroxide, or potassium hydroxide,
   (d) optionally, a biocide, and
   (e) water,
   wherein the polishing composition has a pH of about 1 about 6.

2. The polishing composition of claim 1, wherein the silica is present in the amount of about 0.1 wt. % to about 10 wt. %.

3. The polishing composition of claim 1, where the silica has a mean particle size of about 10 nm to about 80 nm.

4. The polishing composition of claim 1, wherein the compound comprises a salt comprising an anion selected from the group consisting of acetate, chloride, nitrate, and sulfate.

5. The polishing composition of claim 1, wherein the compound is gallium nitrate.

6. The polishing composition of claim 5, wherein the gallium nitrate is present in a concentration of about 1 mM to about 8 mM.

7. The polishing composition of claim 1, wherein the pH is about 2 to about 5.

8. The polishing composition of claim 7, wherein the pH is about 2 to about 4.

9. A method of chemically-mechanically polishing a substrate, which method comprises:
   (i) providing a substrate,
   (ii) contacting the substrate with a polishing pad and a chemical-mechanical polishing composition consisting of:
      (a) condensation-polymerized silica,
      (b) a compound in an amount sufficient to provide about 0.2 mM to about 10 mM of a metal cation selected from the group consisting of gallium (III), chromium (II), and chromium (III),
      (c) a pH adjusting agent selected from the group consisting of nitric acid, sulfuric acid, phosphoric acid, ammonium hydroxide, or potassium hydroxide,
      (d) optionally, a biocide, and
      (e) water,
      wherein the polishing composition has a pH of about 1 to about 6,
   (iii) moving the polishing pad relative to the substrate with the chemical-mechanical polishing composition therebetween, and
   (iv) abrading at least a portion of the substrate to polish the substrate.

10. The method of claim 9, wherein the silica is present in the amount of about 0.1 wt. % to about 10 wt. %.

11. The method of claim 9, where the silica has a mean particle size of about 10 nm to about 80 nm.

12. The method of claim 9, wherein the compound comprises a salt comprising an anion selected from the group consisting of acetate, chloride, nitrate, and sulfate.

13. The method of claim 9, wherein the compound is gallium nitrate.

14. The method of claim 13, wherein the gallium nitrate is present in a concentration of about 1 mM to about 8 mM.

15. The method of claim 9, wherein the pH is about 2 to about 5.

16. The method of claim 15, wherein the pH is about 2 to about 4.

17. The method of claim 9, wherein the substrate comprises a dielectric layer.

18. The method of claim 17, wherein the dielectric layer is selected from the group consisting of silicon dioxide, carbon-doped silicon dioxide, and organically modified silicon glass.

19. The method of claim 18, wherein the substrate further comprises at least one metal layer.

20. The method of claim 19, wherein the at least one metal layer is selected from the group consisting of aluminum, copper, tungsten, and combinations thereof.

21. The method of claim 20, wherein the substrate further comprises at least one barrier layer.

22. The method of claim 21, wherein the at least one barrier layer is selected from the group consisting of tantalum, titanium, nitrides thereof, and combinations thereof.

* * * * *